US012249608B2

(12) United States Patent
Kao et al.

(10) Patent No.: US 12,249,608 B2
(45) Date of Patent: Mar. 11, 2025

(54) METHOD FOR MANUFACTURING SEMICONDUCTOR STRUCTURE AND SEMICONDUCTOR STRUCTURE THEREOF

(71) Applicant: TAIWAN SEMICONDUCTOR MANUFACTURING COMPANY LTD., Hsinchu (TW)

(72) Inventors: Yun-Feng Kao, New Taipei (TW); Katherine H. Chiang, New Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 318 days.

(21) Appl. No.: 17/728,785

(22) Filed: Apr. 25, 2022

(65) Prior Publication Data

US 2023/0343789 A1 Oct. 26, 2023

(51) Int. Cl.

| | |
|---|---|
| ***H01L 27/12*** | (2006.01) |
| ***H01L 21/822*** | (2006.01) |
| ***H01L 23/522*** | (2006.01) |
| ***H01L 23/528*** | (2006.01) |
| *G11C 11/40* | (2006.01) |

(52) U.S. Cl.

CPC ...... *H01L 27/1207* (2013.01); *H01L 21/8221* (2013.01); *H01L 23/528* (2013.01); *G11C 11/40* (2013.01); *H01L 23/5226* (2013.01)

(58) Field of Classification Search

CPC ............. H01L 27/1207; H01L 21/8221; H01L 23/528; H01L 23/5226; H01L 21/8258; H01L 27/088; H01L 27/0688; G11C 11/40; G11C 11/405; H10B 10/125; H10B 10/18

USPC .......................................................... 257/43

See application file for complete search history.

(56) References Cited

U.S. PATENT DOCUMENTS

2006/0216886 A1* 9/2006 Jang .................... H01L 27/0688 257/E27.098
2007/0178693 A1* 8/2007 Jeng ....................... H10B 63/84 257/E27.005
2013/0015448 A1* 1/2013 Yang .................. H01L 27/1251 438/22
2019/0147919 A1* 5/2019 Liaw ...................... G11C 5/025 257/773
2020/0258772 A1* 8/2020 Hsieh ................ H01L 21/76834
2020/0411428 A1* 12/2020 Lilak ................... H01L 25/0657
2021/0183899 A1* 6/2021 Imai .................... H01L 27/1248

* cited by examiner

*Primary Examiner* — Duy T Nguyen

(74) *Attorney, Agent, or Firm* — WPAT Law; Anthony King

(57) ABSTRACT

A semiconductor structure is provided. The semiconductor structure includes an interconnection structure, a first transistor, and a second transistor. The interconnection structure includes a first metal line layer, a second metal line layer and a third metal line layer arranged over one another. The first transistor includes a gate structure. The second transistor is disposed adjacent to the first transistor, and includes a source/drain structure. The gate structure of the first transistor is disposed over and electrically connected to the first metal line layer, and the source/drain structure of the second transistor is arranged below and electrically connected to the second metal line layer through the third metal line layer. A manufacturing method of a semiconductor structure is also provided.

20 Claims, 12 Drawing Sheets

400
10A
74(70D)
142
55b
54b
122
76(70F)
55a
53b
52b
51b
52d
54a
53a
52a
52c
61
62
60
51a
75(70E)
44
43
42
41
40
10
35b
34b
35a
32d
31b
34a
33a
32a
32c
31a
33b
32b
22
21
20
20
30
40
50
60
70
90
70A
70B
70C
70D
70E
70F
70
51
52
521
522
53
54
55
50
31
32
321
322
33
34
35
30

METHOD FOR MANUFACTURING SEMICONDUCTOR STRUCTURE AND SEMICONDUCTOR STRUCTURE THEREOF

BACKGROUND

Semiconductor devices are used in a variety of electronic applications, such as personal computers, cellular phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. As the semiconductor industry has progressed into advanced technology process nodes in pursuit of greater device density, higher performance, and lower costs, challenges of precise control of patterns of each element and component as designed have arisen.

A current common requirement for an advanced electronic circuit and particularly for circuits manufactured as integrated circuits (ICs) in semiconductor processes is the use of embedded or discrete memory devices. Increasingly, such memory devices are provided as macros or portions of integrated circuits and manufactured on a substrate along with other circuitry such as user-defined logic circuitry, microprocessors, microcontrollers, digital signal processors and the like to provide a highly integrated circuit in a single package. Embedded memory arrays may be formed as dynamic random-access memories (DRAMs) or increasingly as static random-access memories (SRAMs). While DRAM cells require less silicon area per stored bit, the DRAM cells require sophisticated memory controllers to perform the periodic refresh cycles needed to maintain the data over time. In contrast, while SRAM cells require more silicon area per stored bit, the SRAM cells maintain the data without the need for refresh cycles and therefore are better suited for some embedded applications. As alternatives, non-volatile memory cells such as flash or EEPROM cells may also be embedded with other circuitry.

Generally a memory cell includes at least a transistor and a deep trench capacitor above the transistor. As the semiconductor industry has progressed into advanced technology process, challenges in formation of the deep trench capacitor are encountered. In addition, a size of a device cannot be further reduced due to a great depth of the deep trench capacitor.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, dimensions of the various features may be arbitrarily increased or reduced for clarity of discussion.

DETAILED DESCRIPTION

Figure 1:
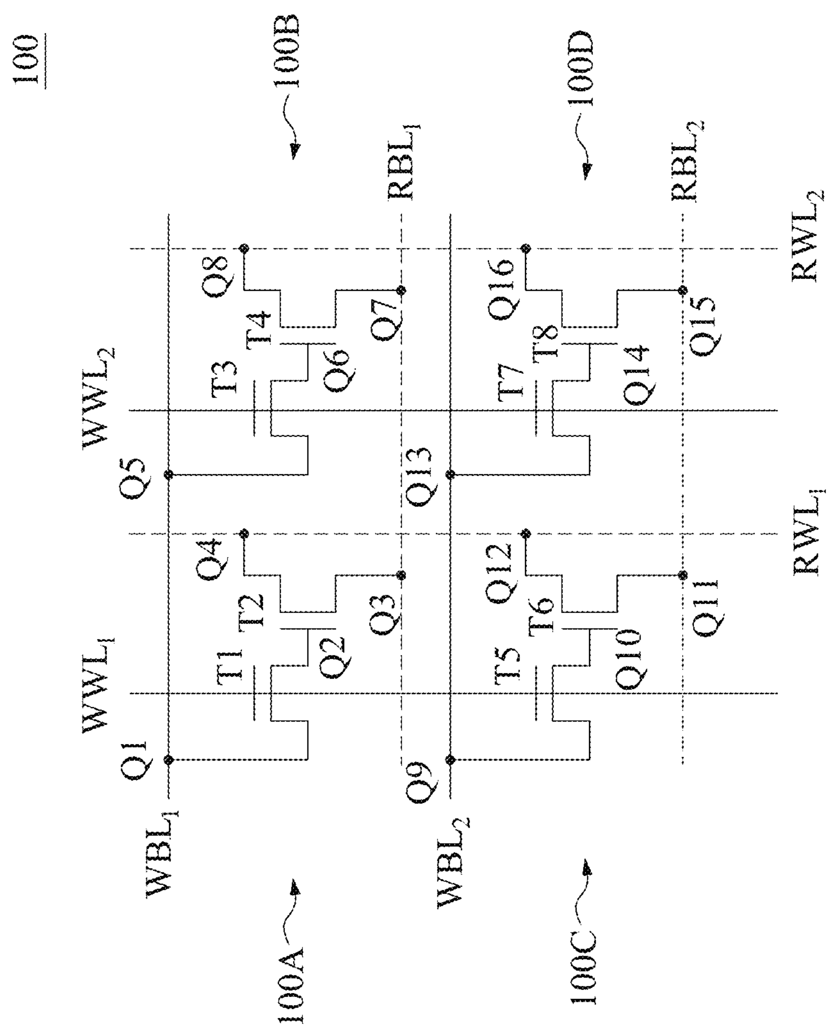
FIG. 1 is a circuit diagram in accordance with some embodiments of the disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a circuit diagram of a memory array 100 in accordance with some embodiments of the present disclosure. The memory array 100 may include a plurality of unit cells, and each unit cell 100A, 100B, 100C or 100D of the memory array 100 of the present disclosure may include two transistors. As shown in FIG. 1, a transistor T1 and a transistor T2 together define a unit cell 100A of the memory array 100. Take the unit cell 100A as an example, a terminal Q1 of the transistor T1 is coupled to a write bit line $WBL_1$, another terminal Q2 of the transistor T1 is coupled to a gate of the transistor T2, and a gate of the transistor T1 is coupled to a write word line $WWL_1$. A terminal Q3 of the transistor T2 is coupled to a read bit line $RBL_1$, and another terminal Q4 of the transistor T2 is coupled to a read word line $RWL_1$. In some embodiments, the transistor T1 is configured to store bit information of the unit cell 100A. In some embodiments, the transistor T1 is configured to access the bit information contained in the transistor T2 through a read or write operation.

In some embodiments, arrangements of other unit cells 100B, 100C and 100D of the memory array 100 are similar to arrangement of the unit cell 100A including the transistors T1 and T2 as illustrated above. In some embodiments, other unit cells 100B, 100C and 100D individually include transistors T3 and T4, transistors T5 and T6, and transistors T7 and T8. In some embodiments, a terminal Q6 of the transistor T3 is coupled to a gate of the transistor T4. In some embodiments, a terminal Q5 is coupled to the write bit line $WBL_1$. In some embodiments, a gate of the transistor T3 and a gate of the transistor T7 are coupled to a write word line $WWL_2$. In some embodiments, a terminal Q7 of the transistor T4 is coupled to the read bit line $RBL_1$. In some embodiments, a terminal Q8 of the transistor T4 and a terminal Q16 of the transistor T8 are coupled to a read word line $RWL_1$. In some embodiments, a terminal Q9 of the transistor T5 and a terminal Q13 of the transistor T7 are coupled to a write bit line $WBL_2$. In some embodiments, a gate of the transistor T5 is coupled to the write word line $WWL_1$. In some embodiments, a terminal Q10 of the transistor T5 is coupled to a gate of the transistor T6. In some embodiments, a terminal Q11 of the transistor T6 and a terminal Q15 of the transistor T8 are coupled to a read bit line $RBL_2$. In some embodiments, a terminal Q12 of the transistor T6 is coupled to the read word line $RWL_1$. In some embodiments, a terminal Q14 of the transistor T7 is coupled to a gate of the transistor T8.

In some embodiments, the memory array 100 is arranged in an interconnection structure disposed over a logic circuit or a logic device, and thus a product size can be minimized. In order to achieve the memory cell 100 in the interconnection structure, the present disclosure provides semiconductor structures in accordance with different embodiments of the present disclosure, and illustration is provided in the following description combined with figures.

Figure 2:
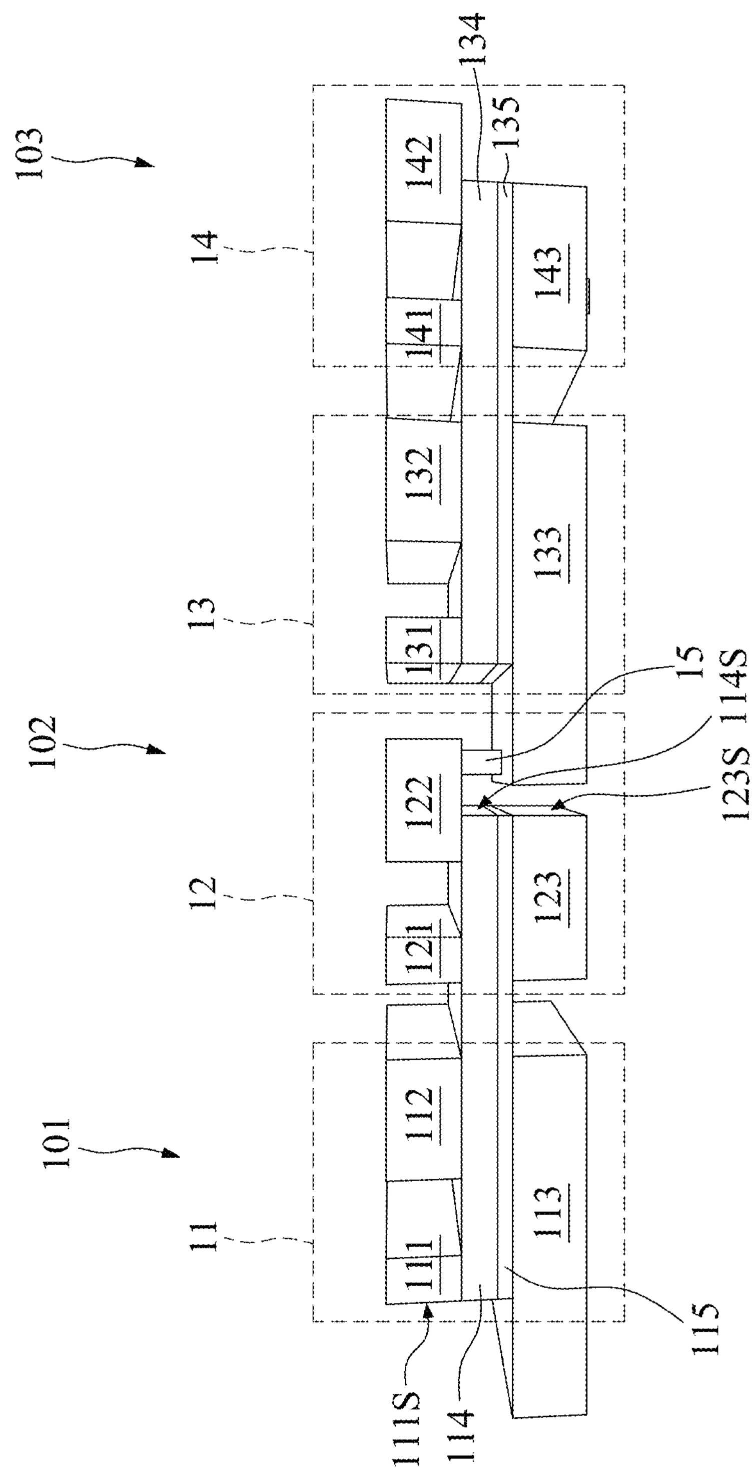
FIG. 2 is a schematic diagram of a semiconductor structure in accordance with some embodiments of the disclosure.

FIG. 2 is a schematic diagram of a semiconductor structure 200 in accordance with some embodiments of the present disclosure. In some embodiments, the semiconductor structure 200 is part of a memory array. In some embodiments, the semiconductor structure 200 is disposed in an interconnection structure over a substrate (detailed illustration is provided in the following description combined with FIG. 3). In some embodiments, the semiconductor structure 200 is disposed between two metal line layers of the interconnection structure. The semiconductor structure 200 may include a first transistor 11, a second transistor 12, a third transistor 13 and a fourth transistor 14 disposed at a same elevation. In some embodiments, at least one of the four transistors 11, 12, 13 and 14 include a thin-film transistor. In some embodiments, each of the four transistors 11, 12, 13, and 14 includes gate structures 113, 123, 133 and 143, respectively, at a same elevation. In some embodiments, the gate structures 113, 123, 133 and 143 are formed concurrently in a same layer. In some embodiments, the gate structures 113, 123, 133 and 143 include a same material. In some embodiments, the material of the gate structure 113, 123, 133 or 143 includes tungsten (W), titanium nitride (TiN), tantalum nitride (TaN), other suitable conductive materials, or a combination thereof. In some embodiments, thicknesses of the gate structures 113, 123, 133 and 143 measured in a vertical direction are substantially different. In some embodiments, the thicknesses of the gate structures 113, 123, 133 and 143 are substantially equal. In some embodiments, the thicknesses of the gate structures 113, 123, 133 and 143 are in a range of 100 to 500 angstroms (Å).

In some embodiments, each of the four transistors 11, 12, 13 and 14 includes source/drain structures 111 and 112, 121 and 122, 131 and 132, and 141 and 142, respectively, at a same elevation higher than the elevation of the gate structures 113, 123, 133 and 143. In some embodiments, the source/drain structures 111, 112, 121, 122, 131, 132, 141 and 142 are formed concurrently in a same layer. In some embodiments, the source/drain structures 111, 112, 121, 122, 131, 132, 141 and 142 include a same material. In some embodiments, the material of the source/drain structures 111, 112, 121, 122, 131, 132, 141 and 142 includes tungsten (W), titanium nitride (TiN), tantalum nitride (TaN), other suitable conductive materials, or a combination thereof. In some embodiments, thicknesses of the source/drain structures 111, 112, 121, 122, 131, 132, 141 and 142 are different. In some embodiments, the thicknesses of the source/drain structures 111, 112, 121, 122, 131, 132, 141 and 142 are substantially equal. In some embodiments, the thicknesses of the source/drain structures 111, 112, 121, 122, 131, 132, 141 and 142 are in a range of 100 to 700 Å. It should be noted that each of elements 111, 112, 121, 122, 131, 132, 141 and 142 can be a source structure or a drain structure of a corresponding transistor. For a purpose of illustration, each of the elements 111, 112, 121, 122, 131, 132, 141 and 142 may be referred to as a source structure, a drain structure, or a source/drain structure in different embodiments, but such terms are not intended to limit the present disclosure.

In some embodiments, a semiconductor layer 114 is disposed between the source/drain structures 111, 112, 121 and 122 and the gate structures 113 and 123. In other words, the source/drain structures and the gate structure of each of the transistors 11 and 12 are on two opposite sides of the semiconductor layer 114. In some embodiments, the semiconductor layer 114 is overlapped by the source/drain structures (e.g., 111, 112, 121 and 122) of the first transistor 11 and the second transistor 12 and overlaps the gate structures (e.g., 113 and 123) of the first transistor 11 and the second transistor 12. In other words, the first transistor 11 and the second transistor 12 have a common semiconductor layer 114.

In some embodiments, a semiconductor layer 134 is disposed between the source/drain structures 131, 132, 141 and 142 and the gate structures 133 and 143. In other words, the source/drain structures and the gate structure of each of the transistors 13 and 14 are on two opposite sides of the semiconductor layer 134. In some embodiments, the semiconductor layer 134 is overlapped by the source/drain structures (e.g., 131, 132, 141 and 142) of the third transistor 13 and the fourth transistor 14 and overlaps the gate structures (e.g., 133 and 143) of the third transistor 13 and the fourth transistor 14. In other words, the third transistor 13 and the fourth transistor 14 have a common semiconductor layer 134. In some embodiments, the semiconductor layer 114 is at a same elevation as the semiconductor layer 134.

In some embodiments, the semiconductor layers 114 and 134 are formed concurrently or by a same patterning operation in a layer. In some embodiments, the semiconductor layers 114 and 134 are formed in the layer after formation of the gate structures (e.g., 113, 123, 133 and 143) and prior to formation of the source/drain structures (e.g., 111, 112, 121, 122, 131, 132, 141 and 142). In some embodiments, the semiconductor layers 114 and 134 is an oxide semiconductor layer. In some embodiments, the semiconductor layers 114 and 134 include a same material. In some embodiments, the material of the semiconductor layers 114 and 134 includes indium zinc oxide (IZO), indium tin oxide (ITO), indium oxide ($In_2O_3$), gallium oxide ($Ga_2O_3$), indium gallium zinc oxide (InGaZnO), zinc oxide (ZnO), aluminum zinc oxide ($Al_2O_5Zn_2$), aluminum doped zinc oxide (AZO), indium tungsten oxide (IWO), titanium oxide ($TiO_x$), semiconductor materials including III-V materials, alloys including a combination of above materials, or a combination thereof. The semiconductor layers 114 and 134 are a single layer structure or a multi-layer structure including one or more of the above-mentioned materials. In some embodiments, thicknesses of the semiconductor layers 114 and 134 are different. In some embodiments, the thicknesses of the semiconductor layers 114 and 134 are substantially equal. In some embodiments, the thickness of the semiconductor layers 114 or 134 is in a range of 30 to 200 Å. In some embodiments, a surficial area of the semiconductor layer 114 or 134 is greater than 1000 $nm^2$. In some embodiments, a width of the semiconductor layer 114 or 134 is greater than 50 nm. In some embodiments, a length of the semiconductor layer 114 or 134 is greater than 200 nm.

In some embodiments, a gate dielectric layer 115 is disposed between the semiconductor layer 114 and the gate structures (e.g., 113 and 123) of the first transistor 11 and the second transistor 12. In some embodiments, the gate dielectric layer 115 is overlapped by the source/drain structures (e.g., 111, 112, 121 and 122) of the first transistor 11 and the second transistor 12 and overlaps all of the gate structures (e.g., 113 and 123) of the first transistor 11 and the second transistor 12. In other words, the first transistor 11 and the second transistor 12 share the gate dielectric layer 115. In some embodiments, a gate dielectric layer 135 is disposed between the semiconductor layer 134 and the gate structures (e.g., 133 and 143) of the third transistor 13 and the fourth transistor 14.

In some embodiments, the gate dielectric layer 135 is overlapped by the source/drain structures (e.g., 131, 132, 141 and 142) of the third transistor 13 and the fourth transistor 14 and overlaps all of the gate structures (e.g., 133 and 143) of the third transistor 13 and the fourth transistor 14. In other words, the third transistor 13 and the fourth transistor 14 share the gate dielectric layer 135. In some embodiments, the gate dielectric layer 135 is at a same elevation as the gate dielectric layer 115. In some embodiments, the gate dielectric layer 135 and the gate dielectric layer 115 are at a same layer.

In some embodiments, the gate dielectric layers 115 and 135 are formed prior to the formation of the semiconductor layers 114 and 134. In some embodiments, the semiconductor layers (e.g., 114 and 134) and the gate dielectric layers (e.g., 115 and 135) are defined by a same patterning operation and are formed concurrently. In some embodiments, the semiconductor layer 114 covers an entirety of the gate dielectric layer 115, and the gate dielectric layer 115 is overlapped by an entirety of the semiconductor layer 114. In some embodiments, the semiconductor layer 134 covers an entirety of the gate dielectric layer 135, and the gate dielectric layer 135 is overlapped by an entirety of the semiconductor layer 134.

The gate structure 113 may laterally extend farther than the semiconductor layer 114 on one side of the gate structure 113 as shown in FIG. 2. In some embodiments, a portion of the gate structure 113 is exposed by the semiconductor layer 114 from a top view perspective for a purpose of electrical connection (further details are provided in the following description). In some embodiments, the semiconductor layer 114 overlaps an entirety of the gate structure 123 of the second transistor 12. In some embodiments, a sidewall 123S of the gate structure 123 is aligned with a sidewall 114S of the semiconductor layer 114, wherein the sidewall 123S of the gate structure 123 is separated apart from and faces the gate structure 133. The source/drain structure 122 may laterally extend farther than the semiconductor layer 114 toward the third transistor 13 as shown in FIG. 2. In some embodiments, a protruding portion of the source/drain structure 122 is outside a coverage area of the semiconductor layer 114 from a top view perspective. In some embodiments, the protruding portion of the source/drain structure 122 vertically overlaps the gate structure 133 of the third transistor 13. In some embodiments, the semiconductor layer 114 is overlapped by an entirety of the source/drain structures 111, 112, and/or 121. In some embodiments, a sidewall 111S of the source/drain structure 111 is aligned with a sidewall 123S of the semiconductor layer 114, wherein the sidewall 111S of the source/drain structure 111 faces away from the transistor 12.

Arrangements and detailed structures of the third transistor 13 and the fourth transistor 14 may be similar to those of the first transistor 11 and second transistor 12, and repeated description is omitted herein. In some embodiments, the third transistor 13 and the fourth transistor 14 are considered as repetitions of the first transistor 11 and the second transistor 12. In some embodiments, the gate structure 133 of the third transistor 13 is similar to the gate structure 113 of the first transistor 11, and a protruding portion of the gate structure 133 laterally extends farther than the semiconductor layer 134 toward the second transistor 12. Therefore, the protruding portion of the source/drain structure 122 vertically overlaps the protruding portion of the gate structure 133 of the third transistor 13.

In order to realize the unit cell as described above and shown in FIG. 1, the semiconductor structure 200 may further include a conductive via 15 to electrically connect a source/drain structure of a transistor to a gate structure of an adjacent transistor. In some embodiments, the conductive via 15 is disposed at a same elevation as the semiconductor layers 114 and 134 and the gate dielectric layers 115 and 135. In some embodiments, the conductive via 15 is disposed between the protruding portion of the source/drain structure 122 and the protruding portion of the gate structure 133. In some embodiments, the source/drain structure 122 of the second transistor 12 is electrically connected to the gate structure 133 of the third transistor 13 through the conductive via 15.

The second transistor 12 and the third transistor 13 together are defined as a unit cell 102 of a memory array. The transistor T1 in FIG. 1 may correspond the second transistor 12 in FIG. 2, wherein the source/drain structure 122 of the second transistor 12 corresponds to the terminal Q2 of the transistor T1. Similarly, in some embodiments, the transistor T2 in FIG. 1 corresponds to the third transistor 13 in FIG. 2, wherein the gate structure 133 of the third transistor 13 corresponds to the gate of the transistor T2. It should be noted that the semiconductor structure 200 can be repeatedly arranged to form a memory array in the interconnection structure. In some embodiments, the first transistor 11 is one of two transistors of a unit cell 101 disposed in a same row as the unit cell 102 and placed previous to the unit cell 102. In some embodiments, the fourth transistor 14 is one of two transistors of a unit cell 103 disposed in the same row as the unit cell 102 and placed after the unit cell 102. Repeated arrangement of the semiconductor structure 200 can be applied, and the memory array 100 as shown in FIG. 1 can be realized by proper electrical connections through the metal lines of the interconnection structure. In some embodiments, the third transistor 13 is configured to store bit information of unit cell 102. In some embodiments, the second transistor 12 is configured to access the bit information stored in the third transistor 13 through a read or write operation.

Figure 3:
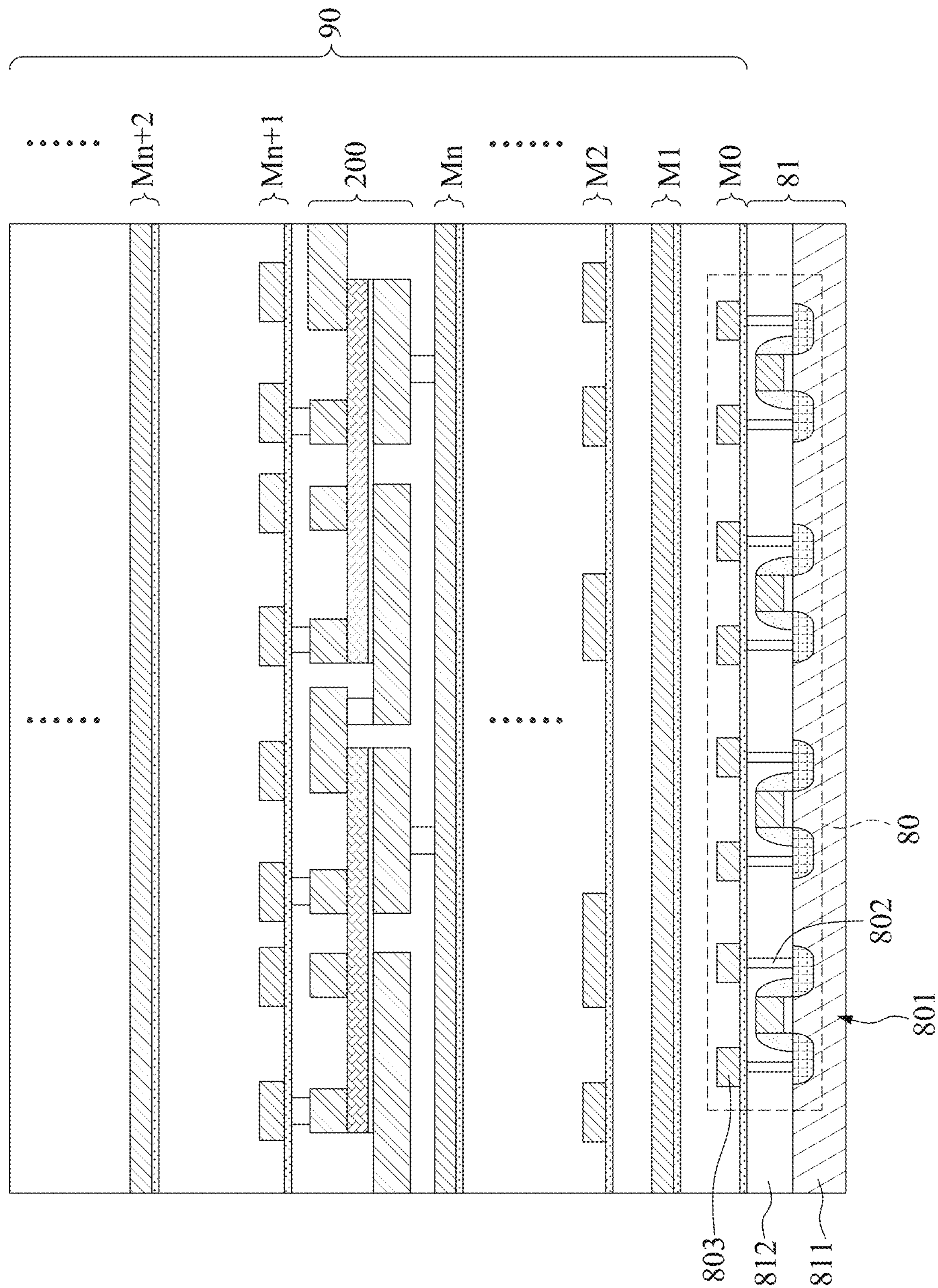
FIG. 3 is a schematic cross-sectional diagram of a semiconductor structure in accordance with some embodiments of the disclosure.

FIG. 3 is a schematic cross-sectional diagram of the semiconductor structure 200 applied in an interconnection structure 90 over a logic device 80 in accordance with some embodiments of the present disclosure. In some embodiments, the logic device 80 is disposed in a substrate layer 81 and the interconnection structure 90 is disposed over the logic device 80. In some embodiments, the logic device 80 includes a plurality of transistors 801. In some embodiments, the substrate layer 81 includes a bulk substrate 811, and an insulating layer 812 formed on the bulk substrate 811 and covering the transistors 801. In some embodiments, the insulating layer 812 is a multi-layered structure. In some embodiments, the logic device 80 further includes a plurality of contacts 802 electrically connected to the plurality of transistors 801. The plurality of contacts 802 may provide electrical connection between source/drain regions and a metal line layer M0 disposed over the insulating layer 812. In some embodiments, the contacts 802 are electrically connected to corresponding metal lines 803 in the metal line layer M0. In some embodiments, the metal line layer M0 is a first metal line layer above the contacts 802. In some embodiments, the metal line layer M0 is a first metal line of the interconnection structure 90 over the substrate layer 81. The interconnection structure 90 may include multiple metal line layers M0, M1, M2, . . . , Mn, Mn+1, Mn+2, . . . , and so forth, wherein n is a positive integer greater than 2. In some embodiments, one or multiple semiconductor structures 200 are disposed between the metal line layers Mn and Mn+1, wherein n is between 3 and 6. In some embodiments, the semiconductor structures 200 are disposed between the metal line layers M3 and M4. In some embodiments, the semiconductor structure(s) 200 vertically overlap(s) at least one transistor 801 of the logic device 80. In some embodiments, the transistors of the semiconductor structure(s) 200 are coupled to the metal line layers Mn, Mn+1 and Mn+2 in order to achieve electrical connections shown in FIG. 1, and the memory array 100 can be therefore realized. The interconnection structure 90 may further include a plurality of metal via layers arranged alternately between the metal line layers for electrical connection between the metal line layers. In some embodiments, each metal line layer is formed of metal lines and intermetal dielectric (IMD) surrounding the metal lines. In some embodiments, each metal via layer is formed of metal vias and IMD surrounding the vias.

In order to further illustrate concepts of the present disclosure, various embodiments are provided below. For a purpose of clarity and simplicity, reference numbers of elements with same or similar functions are repeated in different embodiments. However, such usage is not intended to limit the present disclosure to specific embodiments or specific elements. In addition, conditions or parameters illustrated in different embodiments can be combined or modified to have different combinations of embodiments as long as the parameters or conditions used are not conflicted.

Figure 4:
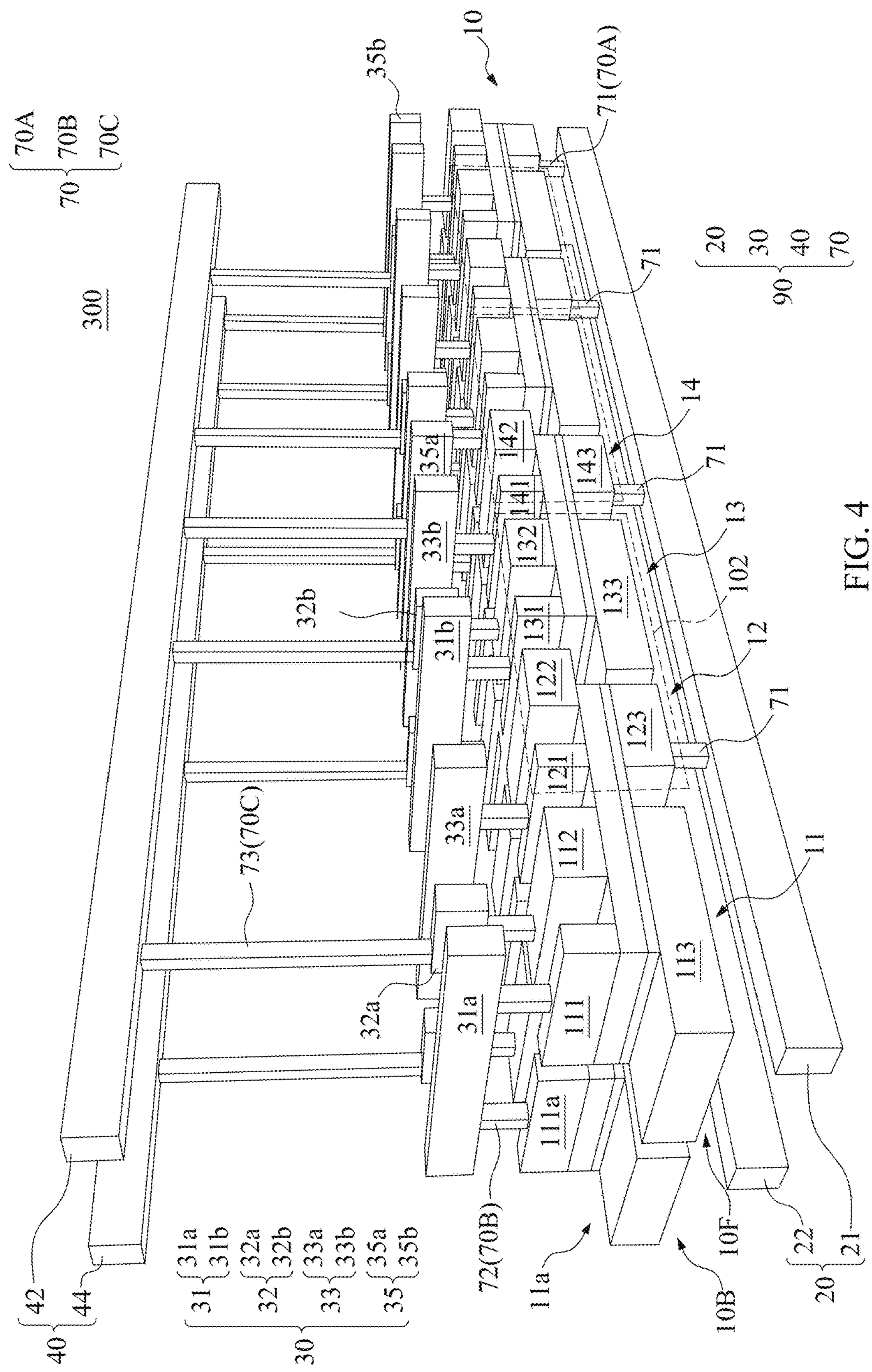
FIGS. 4 and 5 are schematic diagrams of a semiconductor structure from different aspects in accordance with some embodiments of the disclosure.
Figure 5:
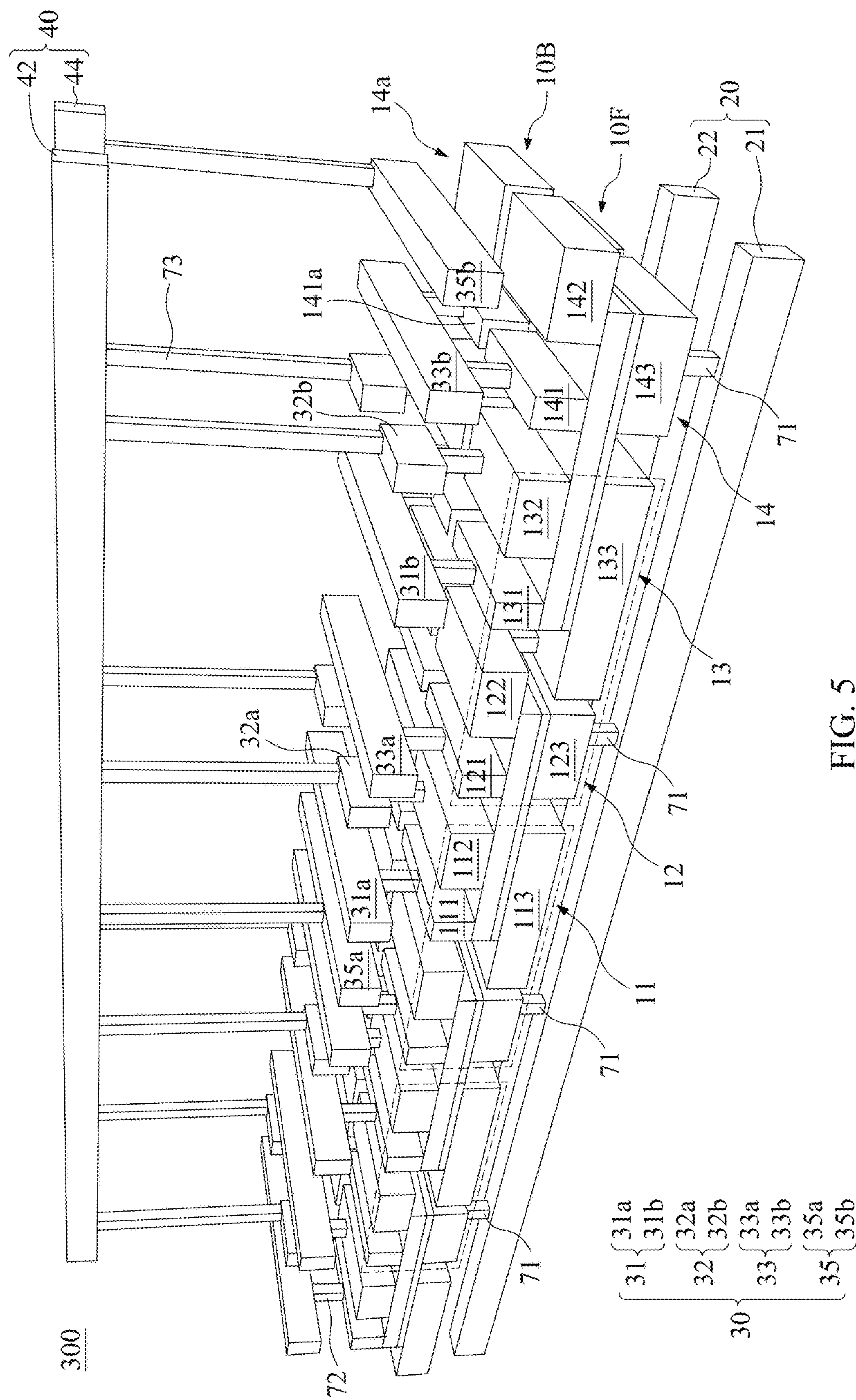

FIGS. 4 and 5 are schematic diagrams of a semiconductor structure 300 from different angles in accordance with some embodiments of the present disclosure. As described above, in order to realize the memory array of FIG. 1, proper electrical connections between the transistors through the metal lines of the interconnection structure are required. The semiconductor structure 200 can be repeatedly arranged to form a memory array 10. In some embodiments, the semiconductor structures 200 are arranged into two rows as shown in FIGS. 4 and 5, and each row includes two of the semiconductor structures 200. In such embodiments, each row includes three unit cells (as shown areas enclosed in dashed lines), and the memory array 10 includes six unit cells. FIGS. 4 and 5 are shown for a purpose of illustration only, and are not intended to limit the present disclosure. In some embodiments, FIGS. 4 and 5 indicate only a portion of the semiconductor structure 300. In other embodiments, the memory array 10 includes more or fewer rows of transistors and/or more or fewer transistors per row. For a purpose of illustration, only transistors 11, 12, 13 and 14 labelled in FIGS. 4 and 5 and related electrical connections are described in detail in the following specification. Other transistors and related electrical connections can be equivalent to the transistors 11, 12, 13 and 14, and repeated description is omitted herein.

Please refer to FIGS. 4 and 5. In some embodiments, the semiconductor structure 300 includes the memory array 10 and metal line layers 20, 30 and 40 of the interconnection structure 90. In some embodiments, the metal line layers 20, 30 and 40 are arranged over one another. In some embodiments, the memory array 10 is disposed between the metal line layers 20 and 30. Each of the metal line layers 20, 30 and 40 may include multiple metal lines. The interconnection structure 90 may further include multiple metal via layers 70 alternately arranged between the multiple metal line layers (e.g., 20, 30 and 40) to electrically connect the metal lines in different metal line layers. In some embodiments, the multiple metal via layers 70 at least include a metal via layer 70A, a metal via layer 70B and a metal via layer 70C.

In some embodiments, a gate structure 123 of the second transistor 12 and a gate structure 143 of the fourth transistor 14 are disposed over and electrically connected to a metal line 21 in the metal line layer 20. In some embodiments, the metal line 21 elongates or extends along an arrangement direction of the transistors 11, 12, 13 and 14. In some embodiments, the arrangement direction defines a first direction. In some embodiments, the metal line 21 vertically overlaps gate structures of all the transistors in a same row of the memory array 10. In some embodiments, the metal line 21 functions as a write word line (e.g., the write word line $WWL_1$ of FIG. 1). In some embodiments, the gate structure 123 of the second transistor 12 and the gate structure 143 of the fourth transistor 14 are electrically connected to the metal line 21 through respective metal vias 71 of the metal via layer 70A disposed between the memory array 10 and the metal line layer 20.

In some embodiments, the source/drain structure 121 is electrically connected to a metal line 33*a* in the metal line layer 30. In some embodiments, the source/drain structure 121 is the source structure of the second transistor 12 and the metal line 33*a* functions as a write bit line (e.g., the write bit line $WBL_t$ of FIG. 1). In some embodiments, the source/drain structure 131 is electrically connected to a metal line 31*b* in the metal line layer 30. In some embodiments, the source/drain structure 131 is the source structure of the third transistor 13, and the metal line 31*b* functions as a read bit line (e.g., the read bit line $RBL_1$ of FIG. 1). In some embodiments, the metal line 33*a* and the metal line 31*b* are substantially parallel. In some embodiments, the metal line 33*a* and the metal line 31*b* elongates or extend along a second direction, which is substantially perpendicular to the first direction. In some embodiments, each of the source/drain structures of all the transistors of the memory array 10 is electrically connected to a corresponding metal line in the metal line layer 30 through a respective metal via 72 of a metal via layer 70B between the memory array 10 and the metal line layer 30.

Please refer to FIG. 4. In some embodiments, the source/drain structure 141 is electrically connected to a metal line 33*b* in the metal line layer 30. In some embodiments, the source/drain structure 141 is the source structure of the fourth transistor 14 and the metal line 33*b* functions as another write bit line (e.g., the write bit line $WBL_2$ of FIG. 1). In some embodiments, the metal line 33*b* elongates or extends along the second direction. In some embodiments, the first transistor 11 is at a periphery region of the memory array 10, and the gate structure 113 is not connected to a metal line. In some embodiments, the first transistor 11 is a dummy transistor. In some embodiments, the first transistor 11 is formed concurrently with other transistors of the memory array 10, but does not function when the memory array 10 is operating.

Please refer to FIG. 5. As described above, the memory array 10 includes repeatedly arranged semiconductor structures 200, and thus at least one of the first transistors 11 is not in the periphery region of the memory array 10, and can function normally when the memory array 10 is operating. The first transistor 11 labelled in FIG. 5 is disposed adjacent to the fourth transistor 14 labelled in FIG. 4. In some embodiments, the source/drain structure 111 is electrically connected to a metal line 31*a* in the metal line layer 30. In some embodiments, the source/drain structure 111 is the source structure of the first transistor 11 and the metal line 31*a* functions as another read bit line (e.g., the read bit line $RBL_2$ of FIG. 1). In some embodiments, the metal line 31*a* elongates or extends along the second direction. In some embodiments, the fourth transistor 14 is in a periphery region of the memory array 10, and the drain structure 142 is not connected to a metal line. In some embodiments the fourth transistor 14 is a dummy transistor. In some embodiments, the fourth transistor 14 is formed concurrently with other transistors of the memory array 10, but does not function when the memory array 10 is operating.

The metal lines functioning as bit lines may all elongate or all extend along the second direction. In some embodiments, those metal lines, being the bit lines in a memory circuit, are electrically connected to source structures of different transistors in different rows of the same layer. For instance, as shown in FIG. 4, a transistor 11*a* is aligned with the first transistor 11 along the second direction in a different row of the same layer. In some embodiments, a source structure 111*a* of the transistor 11*a* is electrically coupled to the source structure 111 of the first transistor 11 through the metal line 31*a*. For another instance, as shown in FIG. 5, a transistor 14*a* is aligned with the fourth transistor 14 along the second direction in a different row of the same layer. In some embodiments, a source structure 141*a* of the transistor 14*a* is electrically coupled to the source structure 141 of the fourth transistor 14 through the metal line 33*b*. Although the first transistor 11 in FIG. 4 and the fourth transistor 14 in FIG. 5 are dummy transistors, the metal line 31*a* labelled in FIG. 4 and the metal line 33*b* labelled in FIG. 5 can show how another bit line is electrically connected to source structures of different transistors in different rows of the same layer.

Figure 6:
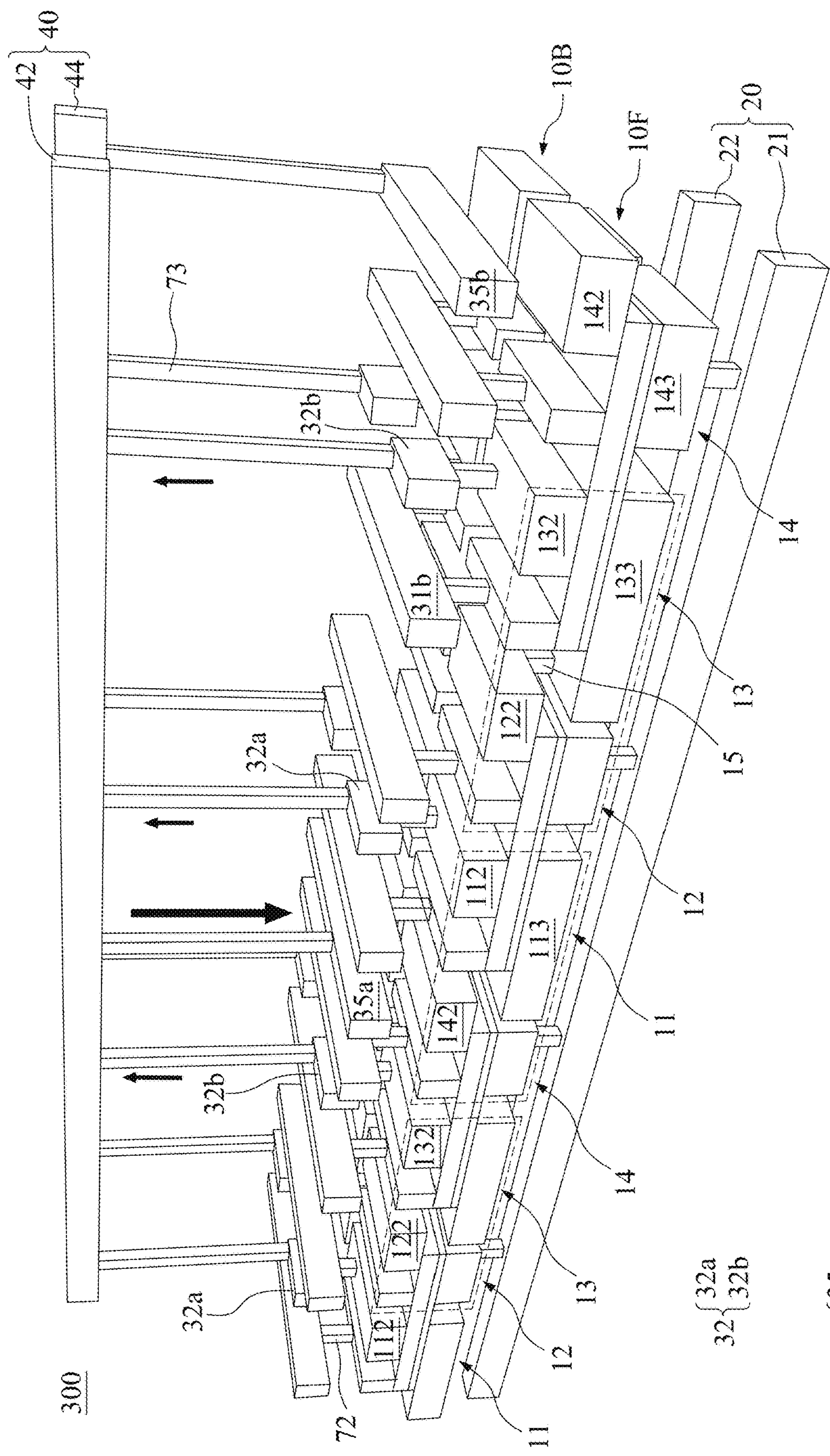
FIGS. 6 and 7 are schematic diagrams of a semiconductor structure showing electrical transmission of different electrical paths in accordance with some embodiments of the disclosure.

FIG. 6 is a schematic diagram specifically showing electrical connections between the metal line layer 30 and a metal line 42 in the metal line layer 40 of the semiconductor structure 300 in accordance with some embodiments of the present disclosure. In order to couple drain structures of different transistors in a same row (i.e., a front row 10F shown in FIG. 6), the drain structures 112, 132 in the row are electrically connected to a metal line 42 in the metal line layer 40 through metal lines 32*a* and 32*b* in the metal line layer 30 and multiple metal vias 72 and 73. The metal lines 32*a* and 32*b* can be relatively short lines compared to adjacent metal lines 31*a*, 33*a*, 31*b* and 33*b* from a top view perspective, and can be referred to as metal segments 32*a* and 32*b* in the following description. In some embodiments, the metal line layer 40 is disposed above the metal line layer 30. In some embodiments, the metal vias 73 of the metal via layer 70C are disposed between the metal line layers 30 and 40. In some embodiments, the metal line layer 40 and the metal line layer 20 are arranged on opposite sides of the metal line layer 30. In some embodiments, the metal line 42 elongates or extends along the first direction. The drain structure 112 of the first transistor 11 and the drain structure 132 of the third transistor 13 may be electrically connected to the metal line 42 in the metal line layer 40. In some embodiments, the drain structure 112 of the first transistor 11 is electrically connected to the metal segment 32*a* in the metal line layer 20 through a corresponding metal via 72 disposed between the metal line layer 30 and the memory array 10. In some embodiments, the drain structure 132 of the third transistor 13 is electrically connected to the metal segment 32*b* in the metal line layer 30 through a corresponding metal via 72. In some embodiments, all of the drain structures 112 of the first transistor 11 and the drain structures 132 of the third transistor 13 in a same row are electrically coupled through the metal line 42. The metal line 42 may be electrically connected to a metal line 35*a* in the metal line layer 30 through a corresponding metal via 73. The metal line 35*a* can be disposed over a drain structure 122 of the second transistor 12 or a drain structure 142 of the fourth transistor 14 in the memory array 10. In some embodiments, the metal line 35*a* is disposed vertically over the drain structure 142 of the fourth transistor 14. In some embodiments, the metal line 35*a* elongates or extends along the second direction. In some embodiments, the metal line 35*a* vertically overlaps the conductive via 15 between the drain structure 142 of the fourth transistor 14 and the gate structure 113 of the adjacent first transistor 11 (not shown). In some embodiments, the metal line 35*a* and/or the metal line 42 function(s) as a read word line (e.g., the read word line RWL1 in FIG. 1). Electrical signals (indicated by small arrows) from the drain structures 112 and 132 may be transmitted to the metal line 42, and as the electrical signals together (indicated by a large arrow) transmitted to the metal line 35*a*. In some embodiments, the metal line 35*a* is electrically connected to a logic device disposed below the memory array 10, and therefore the electrical signals are transmitted to the logic device.

Figure 7:
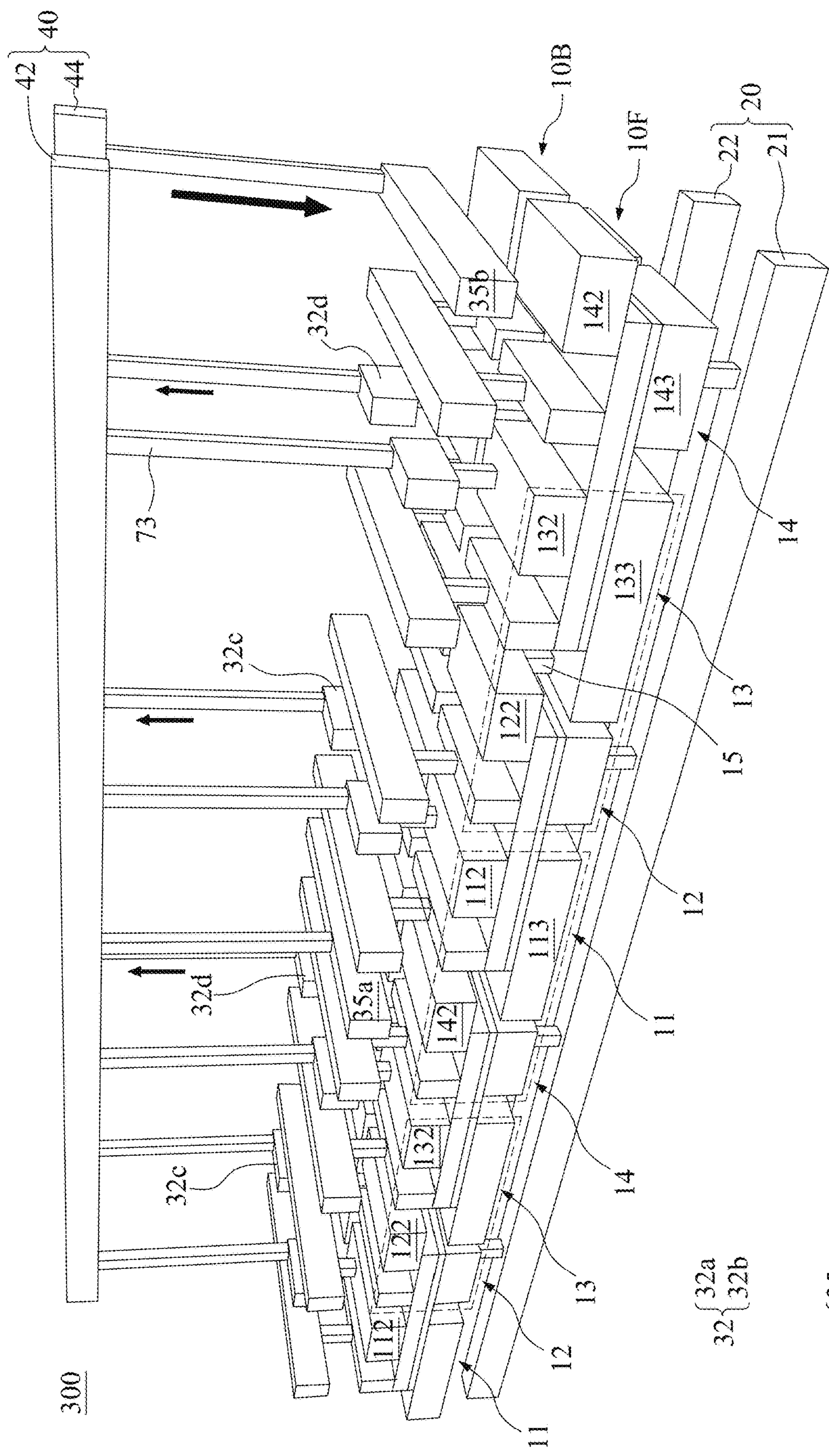

FIG. 7 is a schematic diagram specifically showing electrical connections between the metal line layer 30 and a metal line 44 in the metal line layer 40 of the semiconductor structure 300 in accordance with some embodiments of the present disclosure. In some embodiments, the metal line 44 is substantially parallel to the metal line 42 in the metal line layer 40. In some embodiments, the metal line 44 is electrically coupled to drain structures of different transistors arranged in another row (a back row 10B shown in FIG. 7) different from those coupled to the metal line 42. It should be noted that the arrangement of the transistors in the back row 10B is substantially the same as (or mirrored to) the arrangement of the transistors in the front row 10F. Therefore, reference numbers of elements are repeated to indicate the elements in the back row 10B aligned with corresponding elements in the front row 10F of the memory array 10.

Arrangements of and electrical connections between transistors, vias, metal lines in the metal line layer 30, and the metal line 44 are similar to those as illustrated in FIG. 6 and the related description above. In some embodiments, the drain structures 112 and 132 of the first transistor and the third transistor in the back row 10B are electrically connected to corresponding metal segments 32*c* and 32*d* in the metal line layer 30. In some embodiments, the metal segments 32*c* are aligned with the metal segments 32*a* along the second direction. In some embodiments, the metal segments 32*d* are aligned with the metal segments 32*b* in the second direction. The metal segments 32*c* and 32*d* may be electrically connected to the metal line 44 through a corresponding via 73, and the metal line 44 may be electrically connected to a metal line 35*b* in the metal line layer 30 through another via 73. In some embodiments, electrical signals from the drain structures 112 and 132 in the back row 10B (indicated by small arrows in FIG. 7) of the transistors are collectively transmitted (indicated by a large arrow in FIG. 7) to the metal line 35*b*. In some embodiments, the collective electrical signal is then transmitted to the logic device from the metal line 35*b*. In some embodiments, the metal line 35*b* and/or the metal line 44 function(s) as a read word line (e.g., the read word line $RWL_2$ of FIG. 1). In some embodiments, the metal line 35*b* is disposed vertically over the drain structures 142 of the fourth transistors 14 aligned with each other and placed in different rows. In some embodiments, the metal line 35*b* elongates or extends along the second direction. In some embodiments, the metal line 35*a* elongates or extends along the second direction. In some embodiments, the metal line 35*a* vertically overlaps the conductive via 15 (not shown) between the drain structure 142 of the fourth transistor 14 and the gate structure 113 of the adjacent first transistor 11 in the back row 10B. However, the disclosure is not limited thereto. In alternative embodiments, the metal line 35*b* can be disposed over the drain structures 122 aligned with each other and placed in different rows.

Figure 8:
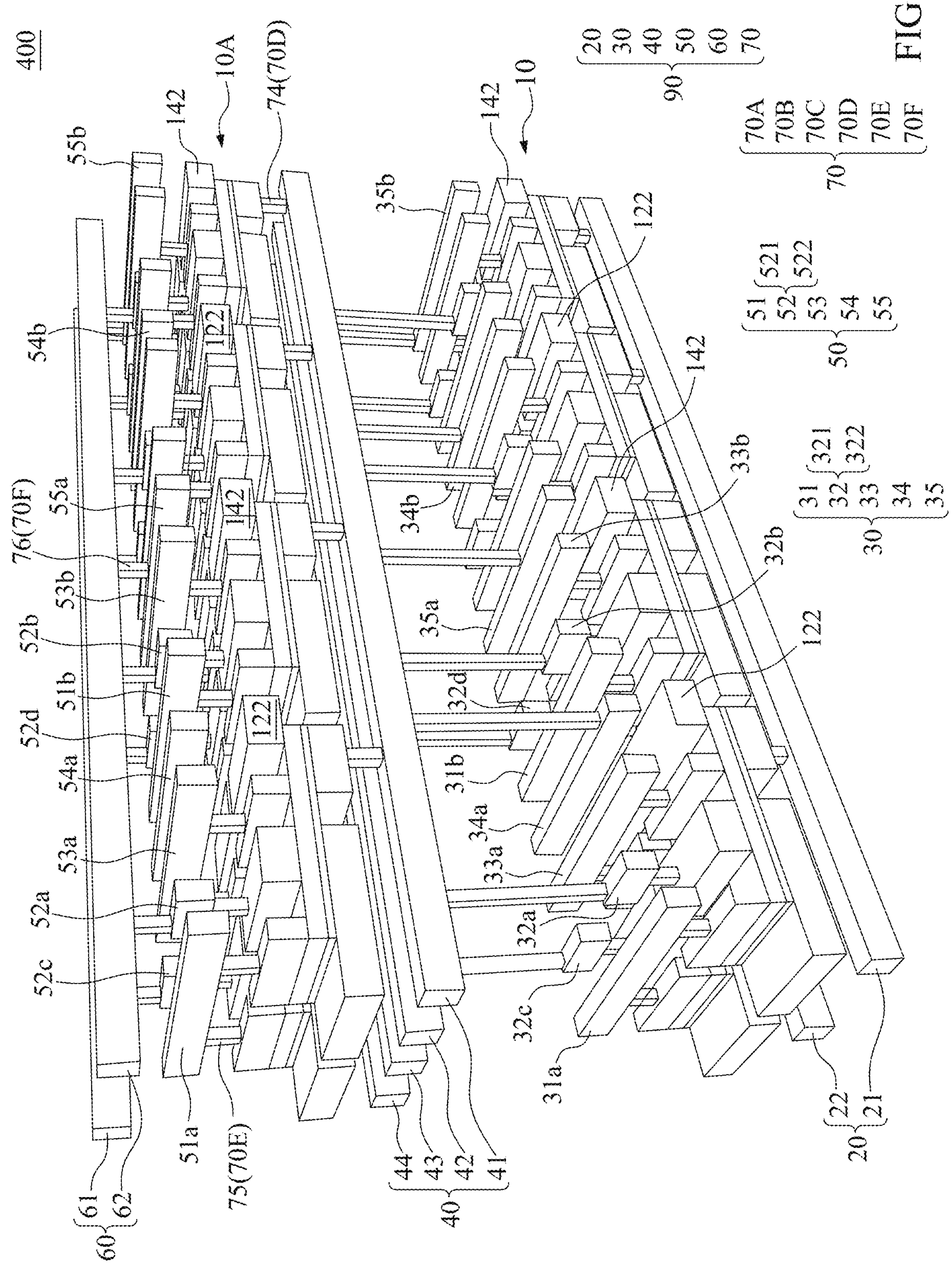
FIG. 8 is a schematic cross-sectional diagram of a semiconductor structure in accordance with some embodiments of the disclosure.

FIG. 8 is a schematic diagram of a semiconductor structure 400 in accordance with some embodiments of the present disclosure. The semiconductor structure 400 may be similar to the semiconductor structure 300 but includes a memory array 10A disposed above the memory array 10. The semiconductor structure 400 may further include metal line layers 50 and 60, metal lines 41 and 42, and metal vias 74, 75 and 76 in different metal via layers 70D, 70E and 70F of the interconnection structure 90. In some embodiments, the semiconductor structure 400 is similar to two vertically stacked semiconductor structures 300. In some embodiments, the memory array 10A is similar to the memory array 10. In some embodiments, arrangement of the metal line layer 50 is similar to that of the metal line layer 30. In some embodiments, metal lines 51*a*, 51*b*, 52*a* to 52*d*, 53*a*, 53*b*, 55*a* and 55*b* in the metal line layer 50 are similar to the metal lines 31*a*, 31*b*, 32*a* to 32*d*, 33*a*, 33*b*, 35*a* and 35*b* in the metal line layer 30. In some embodiments, metal lines 41 and 43 in the metal line layer 40 are similar to the metal lines 21 and 22 in the metal line layer 20. Write word lines (e.g., the metal lines 42 and 44) controlling the memory array 10A can be integrated into the metal line layer 40 with the read word lines (e.g., the metal lines 41 and 44) controlling the memory array 10. In some embodiments, the metal lines 41 and 43 elongates or extend along the first direction. In some embodiments, the metal lines 41 and 43 are substantially parallel.

For a purpose of simplicity of manufacturing process and minimization of a peripheral area saved for electrical routing, metal lines 34*a* and 34*b* are disposed in the metal line layer 30. The metal line 41 can be electrically connected to one of the metal lines 34*a* and 34*b*, and the metal line 43 can be electrically connected to another metal line 34*b* or 34*a*. Therefore, spaces in an area covered by the memory arrays 10 and 10A can be utilized for routing to minimize a routing area. In some embodiments, the area covered by the memory arrays 10 and 10A defines an array area, and areas vertically outside the array area define the peripheral area. In some embodiments, the peripheral area surrounds the array area. In some embodiments, the metal lines 34*a* and 34*b* are respectively disposed above drain structures of aligned fourth transistors 14 in different rows as shown in FIG. 8. In some embodiments, the metal lines 34*a* and 34*b* are respectively disposed above drain structures of aligned second transistors 12 (not shown) in different rows. It should be noted that positions of the metal lines 34*a*, 34*b*, 35*a* and 35*b* are interchangeable depending on different applications. In some embodiments, the metal line 41 is electrically connected to the metal line 34*a*, and the metal line 43 is electrically connected to the metal line 34*b*.

In some embodiments, metal lines 54*a* and 54*b* similar to the metal lines 34*a* and 34*b* are disposed in the metal line layer 50. In the semiconductor structure 400, the metal lines 54*a* and 54*b* are dummy metal lines. A photomask used in formation of the metal line layer 50 may be the same as that used in formation of the metal line layer 30, and thus a manufacturing cost can be reduced and dummy metal lines 54*a* and 54*b* may be formed in the metal line layer 50. In alternative embodiments, the metal lines 54*a* and 54*b* are absent from the metal line layer 50.

The semiconductor structure 400 may further include metal vias 74, 75 and 76 at different elevations for electrical connections between different metal line layers. In some embodiments, the metal vias 74 are disposed between and provide electrical connections between the metal line layer 40 and the memory array 10A. In some embodiments, the metal vias 74 collectively are formed in the metal via layer 70D disposed above the metal line layer 40 and below the memory array 10A. In some embodiments, the metal vias 75 are disposed between and provide electrical connections between the metal line layer 50 and the memory array 10A. In some embodiments, the metal vias 75 are formed in the metal via layer 70E disposed below the metal line layer 50 and above the memory array 10A. In some embodiments, the metal vias 76 are disposed between and provide electrical connections between the metal line layer 60 and the metal line layer 50. In some embodiments, the metal vias 76 are formed in the metal via layer 70F disposed above the metal line layer 50 and below the metal line layer 60. In some embodiments, the metal line layer 60 includes a metal line 62 and a metal line 64 similar to the metal line 42 and the metal line 44, and repeated description is omitted herein. In some embodiments, the metal line layer 60 is a topmost layer of the interconnection structure 90.

FIG. 8 is an exemplary embodiment showing vertically stacked memory arrays. According to the concept and structures illustrated above, more than two layers of memory arrays can be provided in a semiconductor structure. Multiple layers of memory arrays can be vertically and repeatedly stacked according to the arrangement as shown in FIG. 8 and above illustration. A number of layers of memory arrays can be adjusted according to different applications and is not limited herein.

Figure 9:
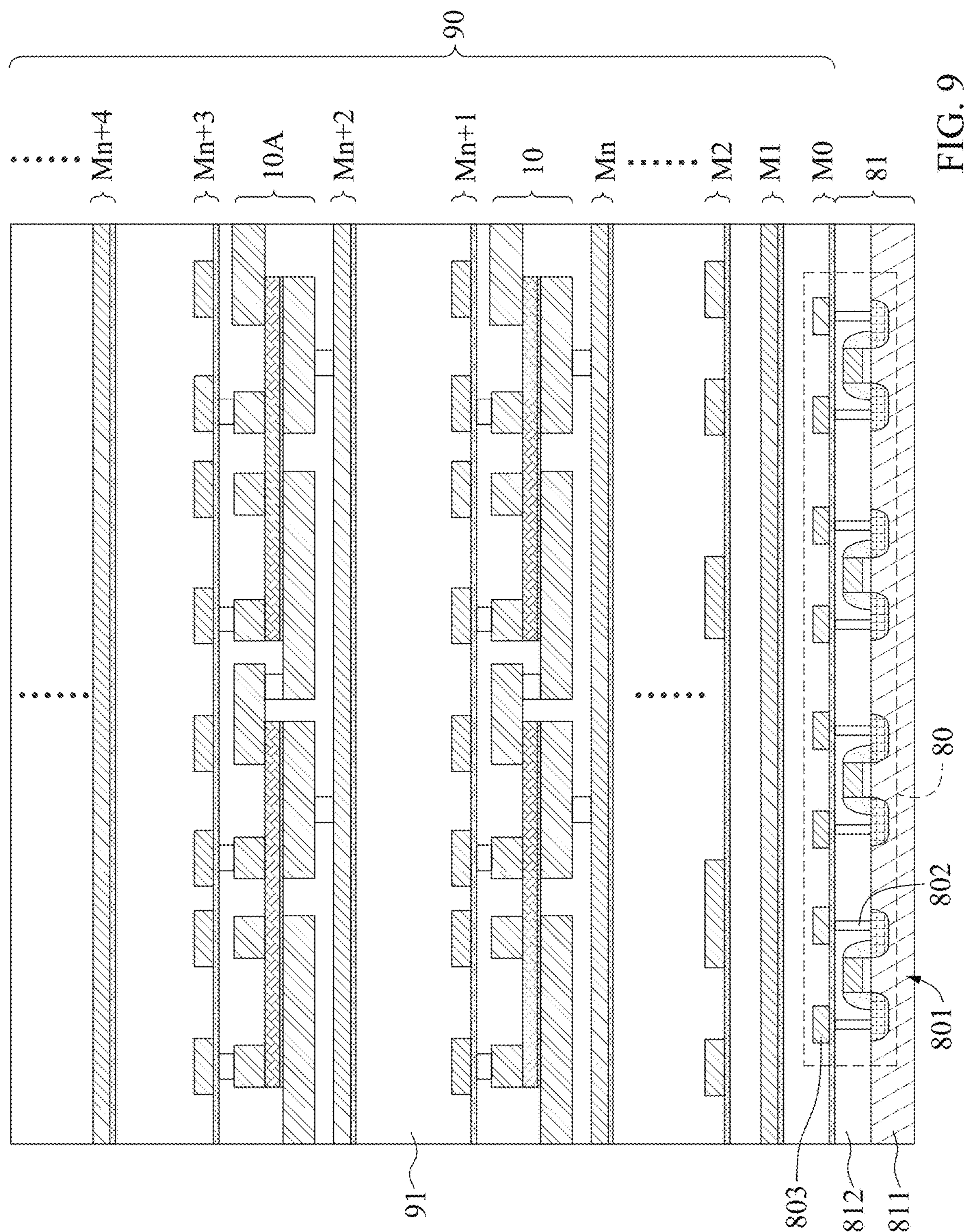
FIG. 9 is a schematic cross-sectional diagram of a semiconductor structure in accordance with some embodiments of the disclosure.

FIG. 9 is a schematic cross-sectional diagram illustrating the semiconductor structure 400 disposed over a logic device 80 in accordance with some embodiments of the present disclosure. The structure of FIG. 9 can be similar to the structure of FIG. 3 except that the structure of FIG. 9 includes one more array (i.e., 10A) in the interconnection structure 90. In some embodiments, the transistors of different memory arrays in different elevations are vertically aligned. In some embodiments, the interconnection structure 90 includes a plurality of dielectric layers 91 surrounding metal lines, vias and transistors. Repetition of other elements is omitted for a purpose of brevity.

Figure 10:
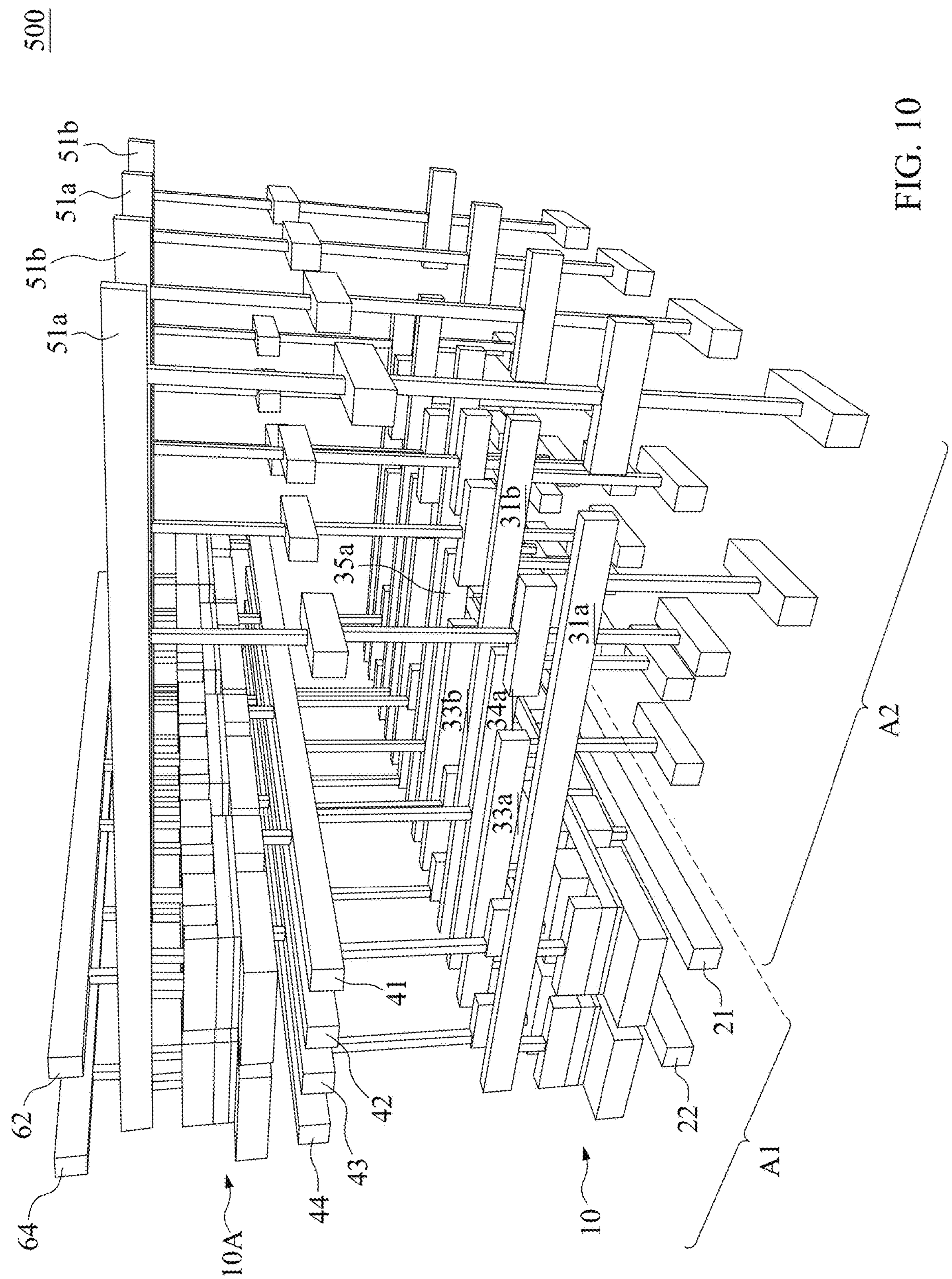
FIG. 10 is a schematic diagram of a semiconductor structure in accordance with some embodiments of the disclosure.

FIG. 10 is a schematic diagram illustrating a semiconductor structure 500 in accordance with some embodiments of the present disclosure. As described above, some of metal lines of a semiconductor structure may extend toward a peripheral area for electrical routing to a logic device disposed under a memory array. FIG. 10 illustrates arrangement of the metal lines in a peripheral area A2 in accordance with some embodiments of the present disclosure. Word lines and bit lines of the semiconductor structure 500 may all extend toward the peripheral area A2, disposed on a first side of an array area A1. In some embodiments, an area vertically covered by memory arrays (e.g., 10 and 10A) defines the array area A1, and an area vertically outside the array area A1 defines the peripheral area A2. In some embodiments, the peripheral area A2 is on a side of the memory arrays 10 and 10A along the second direction as shown in FIG. 10. In some embodiments, the metal lines (e.g., 21, 22, 41 to 44, 62 and 64) extending along the first direction are disposed within the array area A1. In some embodiments, each of the metal lines 21, 22, 41 to 44, 62 and 64 is disposed within the array area A1. Different metal lines (e.g., 31*a*, 31*b*, 33*a*, 33*b*, 34*a*, 34*b*, 35*a* and 35*b*) may have same or different lengths measured along the second direction. In some embodiments, the lengths of the different metal lines are adjusted according to different applications. For instance, as shown in FIG. 10, a length of the metal line 31*a* is greater than a length of the metal line 34*a*, and the length of the metal line 34*a* is greater than a length of the metal line 33*a*. In some embodiments, the length of the metal line 31*a* is substantially equal to a length of the metal line 31*b*. In some embodiments, the length of the metal line 33*a* is substantially equal to a length of the metal line 33*b*. In some embodiments, arrangement of metal lines 51*a*, 51*b*, 53*a*, 53*b* and 54*a* corresponds to arrangement of the metal lines 31*a*, 31*b*, 33*a*, 33*b* and 34*a*. Arrangement of other metal lines can be adjusted and repeated description is omitted herein.

Figure 11:
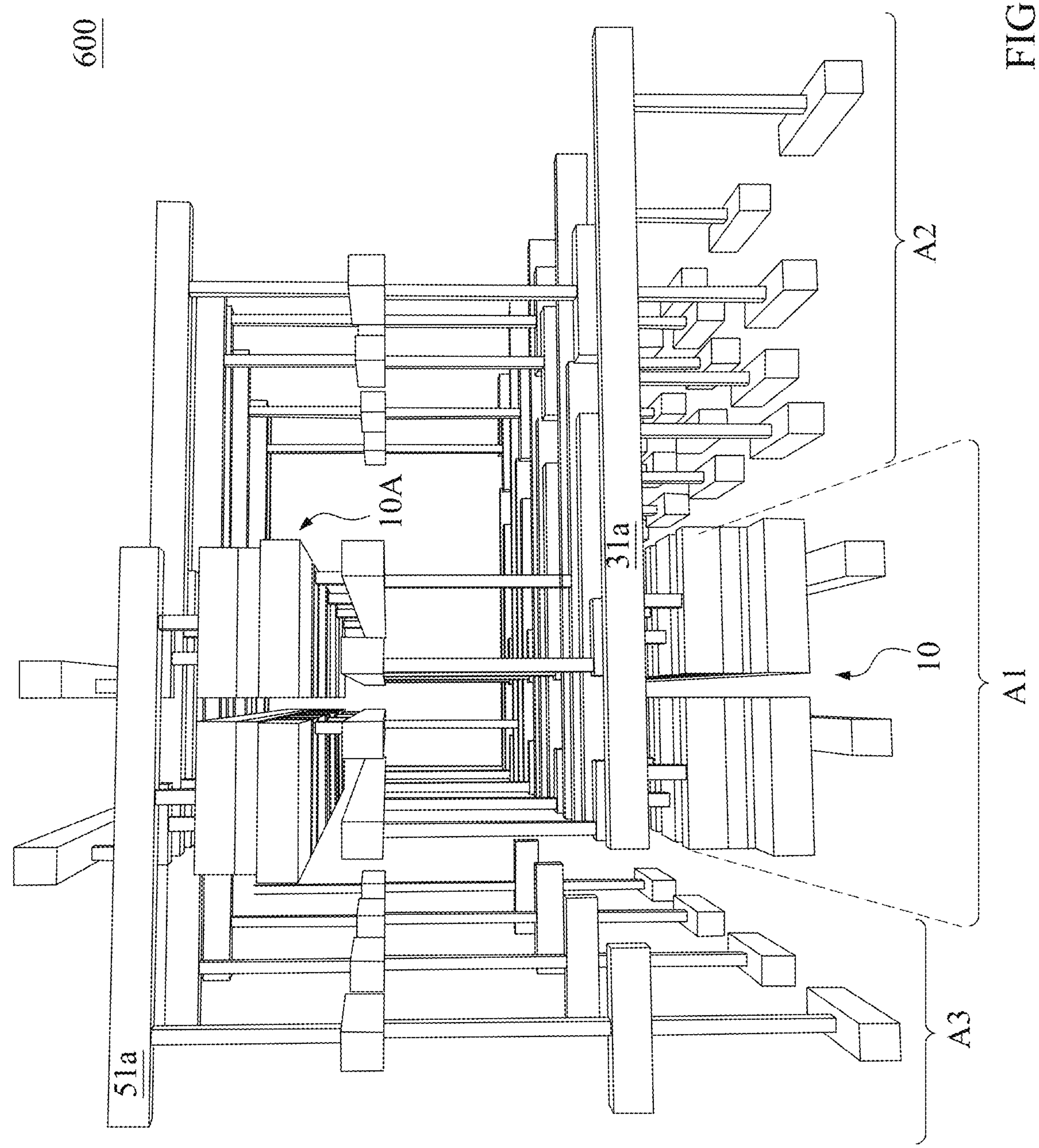
FIG. 11 is a schematic diagram of a semiconductor structure in accordance with some embodiments of the disclosure.

FIG. 10 shows all metal lines extending in the second direction toward one side of the array area A1. However, the present invention is not limited thereto. FIG. 11 is a schematic diagram illustrating a semiconductor structure 600 in accordance with some embodiments of the present disclosure. The metal lines extending along the second direction may extend toward two opposite sides of the array area A1. In some embodiments as shown in FIG. 11, routing of the metal line 51*a* is arranged in a peripheral area A3 opposite to the peripheral area A2 with respect to the array area A1. Since electrical routings to different metal lines are distributed to the different peripheral areas A2 and A3, an area size of each of the peripheral area A3 or A2 in FIG. 11 may be smaller than an area size of the peripheral area A2 in FIG. 10. FIGS. 10 and 11 are exemplary arrangements of routings according to different embodiments. Arrangement of the routings can be adjusted according to different applications.

Figure 12:
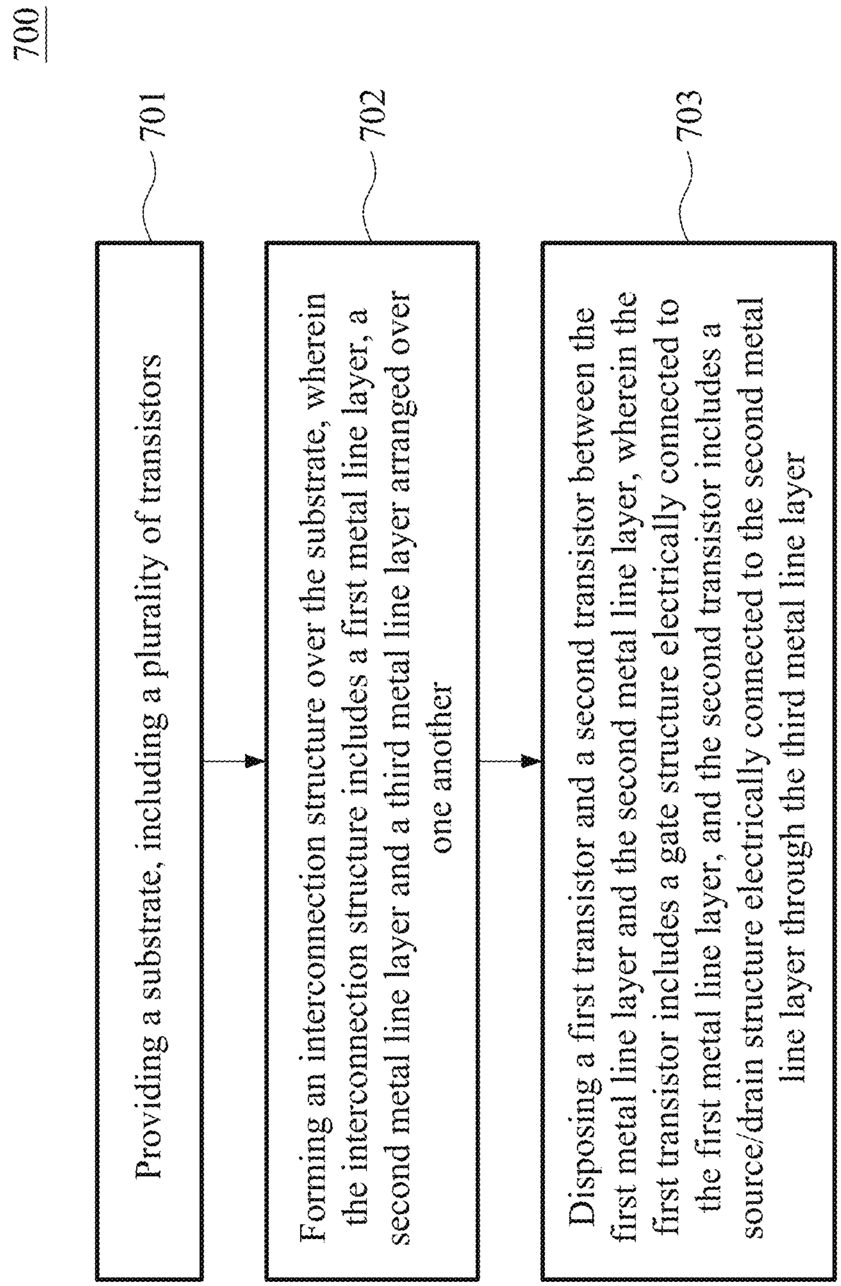
FIG. 12 is a flow diagram of a method of manufacturing a semiconductor structure in accordance with some embodiments of the disclosure.

According to the structures described above, the present disclosure also provides a manufacturing method of a semiconductor structure. FIG. 12 is a flow diagram of a method 700 for manufacturing a semiconductor structure in accordance with some embodiments of the present disclosure. The method 700 includes a number of operations (701, 702 and 703) and the description and illustration are not deemed as a limitation to the sequence of the operations. A substrate having a plurality of control transistors is provided in the operation 701. An interconnection structure is formed over the substrate in the operation 702. The interconnection structure includes a first metal line layer, a second metal line layer and a third metal line layer arranged over one another. A memory unit cell including a first transistor and a second transistor disposed between the first metal line layer and the second metal line layer in the operation 703. The first transistor includes a gate structure and a first source/drain structure, wherein the gate structure of the first transistor is electrically connected to the first metal line layer. The second transistor includes a source/drain structure electrically connected to the second metal line layer through the third metal line layer. In some embodiments, a gate structure of the second transistor is electrically connected to a source/drain structure of the first transistor through a conductive via disposed therebetween. In some embodiments, at least one of the first transistor and the second transistor vertically overlaps with a plurality of control transistors formed in a substrate. It should be noted that the operations of the method 700 may be rearranged or otherwise modified within the scope of the various aspects. Additional processes may be provided before, during, and after the method 700, and some other processes may be only briefly described herein. Thus, other implementations are possible within the scope of the various aspects described herein.

The present disclosure provides a semiconductor structure including a memory array disposed in an interconnection structure and positioned vertically over a logic circuit or a logic device. The memory array includes a plurality of thin-film transistors at a same elevation, and thus the entire memory array can be disposed in a single layer between two metal line layers of the interconnection structure. In some embodiments, the memory array can include multiple layers alternately arranged between metal line layers of the interconnection structure. The memory array and the logic circuit are vertically arranged and thus an area size of a final product can be reduced. In order to further limit a peripheral area for electrical routings, an intra-array conductive via is disposed between a source/drain structure and a gate structure of two adjacent transistors. Generally, a space vertically over or below a source/drain/gate structure is utilized for a corresponding metal line for electrical connection to the source/drain/gate structure. Due to the presence of the intra-array conductive via, a space over the drain structure connecting to the intra-array conductive via is made available for word line routings or other metal line routings. Routings of word lines at a higher elevation can be arranged in an array area; therefore, a peripheral area for routings can be reduced, and manufacturing and material costs can also be reduced. In addition, the word lines and bit lines of the present invention extend out of the array area along a same direction, and thus the peripheral area for routings can be arranged at only one side or at two opposite sides of the array area. An overall area size of the final product can therefore be minimized.

In accordance with some embodiments of the disclosure, a semiconductor structure is provided. The structure includes an interconnection structure, a first transistor, and a second transistor. The interconnection structure includes a first metal line layer, a second metal line layer and a third metal line layer arranged over one another. The first transistor includes a gate structure. The second transistor is disposed adjacent to the first transistor, and includes a source/drain structure. The gate structure of the first transistor is disposed over and electrically connected to the first metal line layer, and the source/drain structure of the second transistor is arranged below and electrically connected to the second metal line layer through the third metal line layer.

In accordance with some embodiments of the disclosure, a semiconductor structure is provided. The structure includes a first thin-film transistor (TFT), a second TFT, and a third TFT. The first TFT is disposed between two metal line layers of an interconnection structure. The second TFT is disposed adjacent to the first TFT, and the first TFT and the second TFT have a semiconductor layer in common. The third TFT is disposed adjacent to the second TFT, wherein a source/drain structure of the second TFT is electrically connected to a gate structure of the third TFT through a conductive via at a same elevation as the semiconductor layer of the first TFT and the second TFT.

In accordance with some embodiments of the disclosure, a method for manufacturing a semiconductor structure is provided. The method may include several operations. A substrate having a plurality of transistors is provided. An interconnection structure is formed over the substrate. The interconnection structure includes a first metal line layer, a second metal line layer and a third metal line layer arranged over one another. A first transistor is disposed between the first metal line layer and the second metal line layer. The first transistor includes a gate structure and a source/drain structure, wherein the gate structure of the first transistor is electrically connected to the first metal line layer, and the source/drain structure is arranged electrically connected to the second metal line layer through the third metal line layer.

The foregoing outlines features of several embodiments so that those skilled in the art may better understand aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:

an interconnection structure, including a first metal line layer, a second metal line layer and a third metal line layer arranged over one another;

a first transistor, including a gate structure; and a second transistor, disposed adjacent to the first transistor, and including a source/drain structure, wherein the gate structure of the first transistor is disposed over and electrically connected to the first metal line layer, and the source/drain structure of the second transistor is arranged below and electrically connected to the third metal line layer through the second metal line layer, wherein the first metal line layer and the third metal line layer are disposed within an array area of the semiconductor structure, and the second metal line layer includes an elongated metal line that extends to a peripheral area of the semiconductor structure outside the array area.

2. The semiconductor structure of claim 1, wherein the third metal line layer and the first transistor are arranged on opposite sides of the second metal line layer.

3. The semiconductor structure of claim 1, wherein the first transistor includes an oxide semiconductor layer, and the gate structure is disposed opposite to a source/drain structure of the first transistor with respect to the oxide semiconductor layer.

4. The semiconductor structure of claim 1, wherein the third metal line layer comprises a first metal line electrically connected to the source/drain structure of the second transistor through a second metal line of the second metal line layer, and the first metal line extends along a direction substantially perpendicular to the second metal line.

5. The semiconductor structure of claim 4, wherein the elongated metal line of the second metal line layer is electrically connected to another source/drain structure of the second transistor, wherein the elongated metal line is substantially parallel to the second metal line.

6. The semiconductor structure of claim 1, wherein the first transistor is disposed between two metal via layers of the interconnection structure.

7. The semiconductor structure of claim 1, further comprising:

a third transistor, disposed below the first metal line layer, wherein a source/drain structure of the third transistor is electrically connected to a fourth metal line of the first metal line layer.

8. The semiconductor structure of claim 7, wherein the gate structure of the first transistor is electrically connected to a fifth metal line of the first metal line layer, and the fourth metal line is substantially parallel to the fifth metal line.

9. The semiconductor structure of claim 1, wherein metal lines of the first metal line layer are substantially parallel to metal lines of the third metal line layer.

10. A semiconductor structure, comprising:

an interconnection structure, including a first metal line layer, a second metal line layer and a third metal line layer arranged over one another;

a first transistor, disposed between the first metal line layer and the second metal line layer, wherein the first transistor includes a first oxide semiconductor layer; and a second transistor, being adjacent to the first transistor and disposed between the first metal line layer and the second metal line layer, wherein the second transistor includes a second oxide semiconductor layer being separated from the first oxide semiconductor layer, and a source/drain structure of the first transistor is electrically connected to a gate structure of the second transistor through a conductive via at a same elevation as the first oxide semiconductor layer or the second oxide semiconductor layer, wherein the first metal line layer and the third metal line layer are disposed within an array area of the semiconductor structure, and the second metal line layer includes an elongated metal line that extends to a peripheral area of the semiconductor structure outside the array area.

11. The semiconductor structure of claim 10, wherein the third metal line layer is disposed over the second metal line layer opposite to the first and second transistors, a gate structure of the first transistor is disposed over and electrically connected to the first metal line layer, and a source/drain structure of the second transistor is arranged below and electrically connected to the third metal line layer through the second metal line layer.

12. The semiconductor structure of claim 10, wherein the first transistor is configured to store bit information of a memory cell, and the second transistor is configured to access the first transistor through a read or write operation.

13. The semiconductor structure of claim 10, further comprising:

a third transistor, disposed adjacent to the first transistor opposite to the second transistor, wherein the third transistor has a third oxide semiconductor layer horizontally connecting the first oxide semiconductor layer.

14. The semiconductor structure of claim 13, further comprising:

a fourth transistor, disposed adjacent to the second transistor opposite to the first transistor, wherein the fourth transistor has a fourth oxide semiconductor layer horizontally connecting the second oxide semiconductor layer.

15. The semiconductor structure of claim 10, wherein the first oxide semiconductor layer or the second oxide semiconductor layer includes indium zinc oxide (IZO), indium tin oxide (ITO), indium oxide ($In_2O_3$), gallium oxide ($Ga_2O_3$), indium gallium zinc oxide (InGaZnO), zinc oxide (ZnO), aluminum zinc oxide ($Al_2O_5Zn_2$), aluminum doped zinc oxide (AZO), indium tungsten oxide (IWO), titanium oxide ($TiO_X$), semiconductor materials including III-V materials, or a combination thereof.

16. The semiconductor structure of claim 10, further comprising:

a logic device, disposed in a substrate below the interconnection structure.

17. The semiconductor structure of claim 16, wherein the logic device includes a plurality of active elements, disposed in the substrate and vertically overlapping at least one of the first transistor and the second transistor.

18. A semiconductor structure, comprising:

an interconnection structure, including a first metal line layer, a second metal line layer and a third metal line layer arranged over one another;

a first transistor, disposed between the first metal line layer and the second metal line layer, the first transistor including a first source/drain structure proximal to the second metal line layer and a first gate structure proximal to the first metal line layer;

a second transistor, being adjacent to the first transistor and disposed between the first metal line layer and the second metal line layer, the second transistor including a second source/drain structure proximal to the second metal line layer and a second gate structure proximal to the first metal line layer, wherein the first source/drain structure vertically overlaps the second gate structure, and the second source/drain structure electrically connects to the third metal line layer through the second metal line layer; and a conductive via, disposed between and electrically connecting the first source/drain structure and the second gate structure, wherein the first metal line layer and the third metal line layer are disposed within an array area of the semiconductor structure, and the second metal line layer includes an elongated metal line that extends to a peripheral area of the semiconductor structure outside the array area.

19. The semiconductor structure of claim 18, wherein the first transistor includes a first oxide semiconductor layer between the first source/drain structure and the first gate structure, the second transistor includes a second oxide semiconductor layer between the second source/drain structure and the second gate structure, and the conductive via is disposed horizontally between the first oxide semiconductor layer and the second oxide semiconductor layer.

20. The semiconductor structure of claim 19, the first oxide semiconductor layer overlaps an entirety of first gate structure, and an overlapping area of the first source/drain structure and the second gate structure is separated from a vertical projection of the second oxide semiconductor layer.

* * * * *